United States Patent
Lee et al.

(10) Patent No.: US 11,047,045 B2
(45) Date of Patent: Jun. 29, 2021

(54) PRECURSOR SUPPLY UNIT, SUBSTRATE PROCESSING SYSTEM, AND METHOD OF FABRICATING SEMICONDUCTOR DEVICE USING THE SAME

(71) Applicant: Samsung Electronics Co., Ltd., Suwon-si (KR)

(72) Inventors: Soyoung Lee, Yongin-si (KR); Hyunjae Lee, Seongnam-si (KR); Ik Soo Kim, Yongin-si (KR); Jang-Hee Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 512 days.

(21) Appl. No.: 16/030,323

(22) Filed: Jul. 9, 2018

(65) Prior Publication Data

US 2019/0055649 A1 Feb. 21, 2019

(30) Foreign Application Priority Data

Aug. 18, 2017 (KR) .................. 10-2017-0104749

(51) Int. Cl.
*C23C 16/455* (2006.01)
*H01L 21/02* (2006.01)
(Continued)

(52) U.S. Cl.
CPC .... *C23C 16/45544* (2013.01); *C23C 16/4412* (2013.01); *C23C 16/4483* (2013.01);
(Continued)

(58) Field of Classification Search
CPC ........ B01B 1/005; B01D 7/00; H01J 37/3244; Y10S 148/169; Y10S 252/95;
(Continued)

(56) References Cited

U.S. PATENT DOCUMENTS 3,358,452 A * 12/1967 Rosen ...................... F02K 5/00
60/200.1
4,226,829 A * 10/1980 Mike ................... A01M 1/2055
422/123
(Continued)

FOREIGN PATENT DOCUMENTS

KR 10-0653313 B1 11/2006
KR 20080079924 A * 9/2008 ......... C23C 16/4481
(Continued)

*Primary Examiner* — Jeffrie R Lund
*Assistant Examiner* — Stanislav Antolin
(74) *Attorney, Agent, or Firm* — Sughrue Mion, PLLC (57) ABSTRACT

Provided are a precursor supply unit, a substrate processing system, and a method of fabricating a semiconductor device using the same. The precursor supply unit may include an outer container, an inner container provided in the outer container and used to store a precursor source, a gas injection line having an injection port, which is provided below the inner container and in the outer container and is used to provide a carrier gas into the outer container, and a gas exhaust line having an exhaust port, which is provided below the inner container and in the outer container and is used to exhaust the carrier gas in the outer container and a precursor produced from the precursor source.

15 Claims, 6 Drawing Sheets

(51) Int. Cl.
*C23C 16/44* (2006.01)
*C23C 16/448* (2006.01)
*C23C 14/24* (2006.01)
*B01B 1/00* (2006.01)

(52) U.S. Cl.
CPC .... *H01L 21/0228* (2013.01); *H01L 21/02175* (2013.01); *B01B 1/005* (2013.01); *C23C 14/243* (2013.01); *C23C 16/4485* (2013.01); *C23C 16/45561* (2013.01)

(58) Field of Classification Search
CPC ... Y10S 252/951; Y10S 261/65; C23C 14/24; C23C 14/243; C23C 14/246; C23C 16/16; C23C 16/4412; C23C 16/4481; C23C 16/4482; C23C 16/4483; C23C 16/4486; C23C 16/45525; C23C 16/45544; C23C 16/45553; C23C 16/45561; C30B 23/00; C30B 23/005; C30B 23/02; C30B 23/06; C30B 23/066; C30B 25/00; C30B 25/02; C30B 25/08; C30B 25/14; C30B 25/16; C30B 25/165; C30B 25/25; H01L 21/02175; H01L 21/0228
See application file for complete search history.

(56) References Cited

U.S. PATENT DOCUMENTS

| | | | | |
|---|---|---|---|---|
| 4,348,980 | A * | 9/1982 | Thevenot | C23C 8/68 118/717 |
| 4,947,790 | A * | 8/1990 | Gartner | C23C 16/4481 118/715 |
| 5,224,202 | A * | 6/1993 | Arnold | C23C 16/4483 392/389 |
| 5,377,429 | A * | 1/1995 | Sandhu | B01D 7/00 118/715 |
| 5,536,323 | A * | 7/1996 | Kirlin | C23C 16/408 118/726 |
| 5,553,395 | A * | 9/1996 | Wen | C23C 16/4481 118/726 |
| 5,603,169 | A * | 2/1997 | Kim | C23C 16/4481 34/587 |
| 5,766,458 | A * | 6/1998 | Sekhar | C04B 38/0615 210/184 |
| 5,904,771 | A * | 5/1999 | Tasaki | C30B 23/002 117/105 |
| 6,063,185 | A * | 5/2000 | Hunter | C30B 29/38 117/84 |
| 6,149,975 | A * | 11/2000 | Tasaki | C23C 16/409 117/948 |
| 6,270,839 | B1 * | 8/2001 | Onoe | C23C 16/4481 118/726 |
| 6,424,800 | B1 * | 7/2002 | Kim | C23C 16/4481 118/724 |
| 6,444,038 | B1 * | 9/2002 | Rangarajan | C23C 16/4481 118/715 |
| 6,921,062 | B2 | 7/2005 | Gregg et al. | |
| 7,799,416 | B1 * | 9/2010 | Chan | C08F 297/00 428/304.4 |
| 8,029,621 | B2 | 10/2011 | Yamasaki et al. | |
| 8,313,804 | B2 | 11/2012 | Carlson et al. | |
| 9,308,501 | B2 | 4/2016 | Hu et al. | |
| 9,605,346 | B2 | 3/2017 | Smith | |
| 2002/0078894 | A1 * | 6/2002 | Timmons | C23C 16/4481 118/726 |
| 2003/0192471 | A1 * | 10/2003 | Jurgensen | C23C 14/185 117/89 |
| 2004/0013577 | A1 * | 1/2004 | Ganguli | C23C 16/4481 422/129 |
| 2004/0016404 | A1 * | 1/2004 | Gregg | C23C 16/45544 118/726 |
| 2004/0025370 | A1 * | 2/2004 | Guenther | C23C 16/4481 34/576 |
| 2005/0006799 | A1 * | 1/2005 | Gregg | C23C 16/4481 261/119.1 |
| 2005/0008799 | A1 * | 1/2005 | Tomiyasu | C30B 25/14 428/34.1 |
| 2005/0039794 | A1 * | 2/2005 | Birtcher | C23C 16/4481 137/268 |
| 2005/0189072 | A1 * | 9/2005 | Chen | C23C 16/4402 156/345.29 |
| 2006/0032440 | A1 * | 2/2006 | Nolan | C23C 14/228 118/715 |
| 2006/0121198 | A1 * | 6/2006 | Shenai-Khatkhate | C23C 16/4481 427/255.28 |
| 2006/0151461 | A1 * | 7/2006 | Sandhu | C23C 16/4481 219/388 |
| 2006/0177576 | A1 * | 8/2006 | Long | C23C 14/12 427/248.1 |
| 2006/0185598 | A1 * | 8/2006 | Suzuki | C23C 16/4481 118/726 |
| 2006/0219168 | A1 * | 10/2006 | Brcka | C23C 16/16 118/715 |
| 2006/0224008 | A1 * | 10/2006 | Suzuki | C23C 16/4481 556/136 |
| 2007/0163713 | A1 * | 7/2007 | Kasai | H01L 21/67017 156/345.3 |
| 2007/0175397 | A1 * | 8/2007 | Tomiyasu | C23C 16/4481 118/726 |
| 2008/0014350 | A1 * | 1/2008 | Carlson | C23C 16/4482 427/255.21 |
| 2008/0026188 | A1 * | 1/2008 | D'urso | G02B 6/02314 428/188 |
| 2008/0143002 | A1 * | 6/2008 | Steidl | C23C 16/448 261/122.1 |
| 2008/0191153 | A1 * | 8/2008 | Marganski | C23C 14/564 250/492.21 |
| 2008/0202426 | A1 * | 8/2008 | Suzuki | C23C 16/4481 118/726 |
| 2008/0226821 | A1 * | 9/2008 | Patrovsky | C23C 16/4488 427/255.39 |
| 2008/0241805 | A1 * | 10/2008 | Schantz | C23C 16/08 434/218 |
| 2009/0107401 | A1 * | 4/2009 | Reinhold | C23C 14/228 118/726 |
| 2009/0142256 | A1 * | 6/2009 | Wakayama | C01G 49/02 423/630 |
| 2009/0181168 | A1 * | 7/2009 | Chaubey | C23C 16/4481 427/248.1 |
| 2009/0250006 | A1 * | 10/2009 | Yamasaki | C23C 16/4481 118/726 |
| 2009/0304558 | A1 * | 12/2009 | Patton | B01J 7/02 422/148 |
| 2010/0236480 | A1 * | 9/2010 | Hara | C23C 16/4481 118/725 |
| 2010/0255198 | A1 * | 10/2010 | Cleary | C23C 16/45544 427/255.39 |
| 2011/0120053 | A1 * | 5/2011 | Abe | C30B 25/14 53/79 |
| 2011/0171383 | A1 * | 7/2011 | Woelk | C23C 16/4482 427/255.23 |
| 2011/0226236 | A1 * | 9/2011 | Buchberger | A24F 40/46 128/200.23 |
| 2012/0034378 | A1 * | 2/2012 | Woelk | C23C 16/4481 427/248.1 |
| 2012/0040516 | A1 * | 2/2012 | Xia | C23C 14/24 438/478 |
| 2012/0266967 | A1 * | 10/2012 | Kanjolia | C23C 16/4483 137/1 |
| 2013/0105483 | A1 * | 5/2013 | Carlson | C23C 16/4483 220/367.1 |
| 2013/0203202 | A1 * | 8/2013 | Xiong | H01L 21/6776 438/57 |
| 2013/0312855 | A1 * | 11/2013 | Birtcher | B01D 46/2403 137/544 |

(56) References Cited

U.S. PATENT DOCUMENTS

| | | | |
|---|---|---|---|
| 2014/0096284 A1* | 4/2014 | Martin-Ortigosa | A61K 9/5089 800/293 |
| 2014/0116944 A1* | 5/2014 | Hu | B01D 69/125 210/650 |
| 2014/0302687 A1* | 10/2014 | Ashihara | H01L 21/02271 438/780 |
| 2015/0053134 A1* | 2/2015 | Lee | C23C 14/228 118/715 |
| 2015/0136027 A1* | 5/2015 | Hara | C23C 14/228 118/715 |
| 2015/0191819 A1* | 7/2015 | Hendrix | C23C 14/12 427/248.1 |
| 2015/0231595 A1* | 8/2015 | Kim | C23C 16/4481 118/724 |
| 2015/0275358 A1* | 10/2015 | Smith | A61K 9/5089 800/293 |
| 2016/0214991 A1* | 7/2016 | Tarutani | H01L 21/6776 438/57 |
| 2016/0308171 A1* | 10/2016 | Lee | C23C 16/4483 220/367.1 |
| 2017/0204532 A1* | 7/2017 | Land | C23C 14/24 438/478 |
| 2017/0298507 A1* | 10/2017 | Lee | A24F 40/46 128/200.23 |
| 2019/0186002 A1* | 6/2019 | Musarrat | A01M 1/2055 422/123 |

FOREIGN PATENT DOCUMENTS

| | | | |
|---|---|---|---|
| KR | 10-1098359 B1 | 12/2011 | |
| KR | 101098359 B1 * | 12/2011 | |
| KR | 10-1324290 B1 | 11/2013 | |
| KR | 2015-0143158 A | 12/2015 | |
| KR | 20150143158 A * | 12/2015 | |
| WO | WO-2015164029 A1 * | 10/2015 | C23C 16/4481 |

* cited by examiner

PRECURSOR SUPPLY UNIT, SUBSTRATE PROCESSING SYSTEM, AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2017-0104749, filed on Aug. 18, 2017, in the Korean Intellectual Property Office, the contents of which are hereby incorporated by reference in its entirety.

FIELD

The present disclosure relates to a system for and a method of fabricating a semiconductor device, and in particular, to a precursor supply unit, a substrate processing system, and a method of fabricating a semiconductor device using the same.

BACKGROUND

Generally, a process of fabricating a semiconductor device includes a process of depositing a thin film using, for example, a chemical vapor deposition (CVD) method or an atomic layer deposition (ALD) method. A precursor source in a liquid or solid state is used in the thin film deposition process. The liquid or solid precursor source is vaporized or sublimated to form a vaporized or gaseous precursor. The precursor is delivered into a chamber by a carrier gas. In a general precursor supply unit, a source consumption space on the precursor source may be the same as the precursor passage space. If the precursor source is consumed, a supply pressure of the precursor may be reduced. If the supply pressure is reduced, a deposition rate of a thin film is reduced.

SUMMARY

Some embodiments of the inventive concept provide a precursor supply unit and/or a processing system, which are configured to prevent or suppress a reduction in the supply pressure of a precursor in a gas phase, which may occur when a liquid or solid precursor source is consumed.

Some embodiments of the inventive concept provide a method of preventing a deposition rate from being decreased and a method of fabricating a semiconductor device using the same.

According to some embodiments of the inventive concept, a precursor supply unit may include an outer container, an inner container provided in the outer container and used to store a precursor source, a gas injection line having an injection port, which is provided below the inner container and in the outer container and is used to provide a carrier gas into the outer container, and a gas exhaust line having an exhaust port, which is provided below the inner container and in the outer container and is used to exhaust the carrier gas in the outer container and a precursor produced from the precursor source. The inner container may include a supporting membrane supporting the precursor source. The supporting membrane may have pores that are permeable to the carrier gas and the precursor. The supporting membrane provides a precursor passage space defined by a first internal space between an inner bottom of the outer container and a bottom surface of the supporting membrane.

According to some embodiments of the inventive concept, a substrate processing system may include a chamber including a susceptor, which is configured to receive a substrate, a precursor supply unit supplying a precursor onto the substrate, and a carrier gas supply unit supplying a carrier gas, which is used to deliver the precursor in the chamber, into the precursor supplying unit. The precursor supply unit may include an outer container, an inner container provided in the outer container and used to store a precursor source, a gas injection line having an injection port, which is provided below the inner container and in the outer container and is used to provide a carrier gas into the outer container, and a gas exhaust line having an exhaust port, which is provided below the inner container and in the outer container and is used to provide the carrier gas in the outer container and the precursor. The inner container may include a supporting membrane supporting the precursor source. The supporting membrane may have pores that are permeable to the carrier gas and the precursor. The supporting membrane provides a precursor passage space defined by a first internal space between an inner bottom of the outer container and a bottom surface of the supporting membrane.

According to some embodiments of the inventive concept, a method of fabricating a semiconductor device may include providing a precursor and a carrier gas on a substrate in a chamber and providing a reaction gas, which can be reacted with the precursor, on the substrate to form a thin film on the substrate. Providing the precursor and the carrier gas may include supplying a carrier gas into a precursor passage space between a supporting membrane of an inner container and an inner bottom surface of an outer container, the inner container containing a precursor source, providing the carrier gas to the precursor source on the supporting membrane through pores of the supporting membrane, and obtaining the precursor through the pores using the carrier gas, without a reduction in supply pressures of the carrier gas and the precursor according to consumption of the precursor source in the inner container.

According to some embodiments of the inventive concept, the source consumption space and the gas pathway space may be separated from each other, and thus, it may be possible to prevent the supply pressure of the precursor gas and the carrier gas from being reduced.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below.

These drawings are not, however, to scale and may not precisely reflect the structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
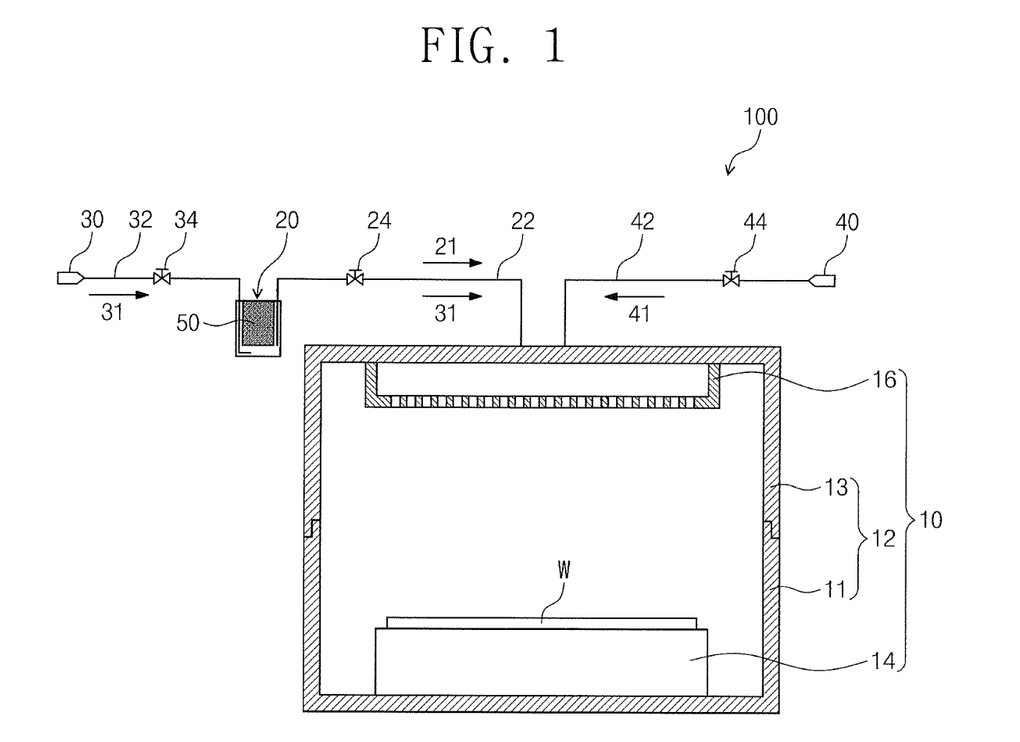
FIG. 1 is a diagram illustrating a substrate processing system according to some embodiments of the inventive concept.

FIG. 1 illustrates a substrate processing system 100 according to some embodiments of the inventive concept.

Referring to FIG. 1, the substrate processing system 100 may be a chemical vapor deposition (CVD) system or an atomic layer deposition (ALD) system. Alternatively, the substrate processing system 100 may be a substrate etching system. In some embodiments, the substrate processing system 100 may include a chamber 10, a precursor supplying unit 20, a carrier gas supplying unit 30, a reaction gas supplying unit 40, first to third gas lines 22, 32, and 42, and first to third valves 24, 34, and 44.

The chamber 10 may provide space for isolating a substrate W from the outside. In some embodiments, the chamber 10 may include a housing 12, a susceptor 14, and a shower head 16. The housing 12 may be provided to surround the susceptor 14 and the shower head 16. The housing 12 may include a lower housing 11 and an upper housing 13. The susceptor 14 may be provided in the lower housing 11. If the lower housing 11 is separated from the upper housing 13, the substrate W may be loaded or unloaded on or from the susceptor 14 by using a robot arm (not shown). The upper housing 13 may be provided on the lower housing 11. The shower head 16 may be provided in the upper housing. The shower head 16 may be used to supply a precursor 21, a carrier gas 31, and a reaction gas 41 onto the substrate W.

The precursor supplying unit 20 may be configured to produce a vaporized or gaseous precursor 21 from a liquid and/or solid precursor source 50. The precursor source 50 may include at least one of liquid organo-metallic compounds (e.g., tetrakis(dimethylamido)titanium (TDMAT), or hexacarbonyl(3,3-dimethyl-1-butyne)dicobalt (CCTBA)) or solid compounds (e.g., hafnium chloride (HfCl4), pentakis-dimethylamino tantalum (PDMAT), or WClx (x=6)), but the inventive concept is not limited thereto. The vaporized or gaseous precursor 21 may have a molecule size smaller than that of the precursor source 50.

The carrier gas supplying unit 30 may be used to provide the carrier gas 31 into the precursor supplying unit 20. The carrier gas 31 may include an inactive or inert gas (e.g., argon gas or helium gas). The carrier gas 31 may be used to carry and/or deliver the precursor 21 in the precursor supplying unit 20 into the chamber 10.

The reaction gas supplying unit 40 may be configured to supply the reaction gas 41 into the chamber 10. The reaction gas 41 may be reacted with the precursor 21 on the substrate W to form a thin film deposited on the substrate W. The reaction gas 41 may include hydrogen ($H_2$) gas or ammonia ($NH_3$) gas.

The first gas line 22 may be configured to connect the precursor supplying unit 20 to the chamber 10. The precursor 21 and the carrier gas 31 may be supplied into the chamber 10 through the first gas line 22. The second gas line 32 may be configured to connect the carrier gas supplying unit 30 to the precursor supplying unit 20. The carrier gas 31 may be supplied into the precursor supplying unit 20 through the second gas line 32. The third gas line 42 may be configured to connect the reaction gas supplying unit 40 to the chamber 10. The reaction gas 41 may be supplied into the chamber 10 through the third gas line 42.

The first to third valves 24, 34, and 44 may be coupled to the first to third gas lines 22, 32, and 42, respectively. The first valve 24 may be provided between the chamber 10 and the precursor supplying unit 20. The first valve 24 may be used to control supply flow rates of the precursor 21 and the carrier gas 31. The second valve 34 may be provided between the precursor supplying unit 20 and the carrier gas supplying unit 30. The second valve 34 may be used to control a supply flow rate of the carrier gas 31. The third valve 44 may be provided between the reaction gas supplying unit 40 and the chamber 10. The third valve 44 may be used to control a supply flow rate of the reaction gas 41.

Although not shown, a purge gas supplying unit may be configured to supply a purge gas (e.g., nitrogen gas ($N_2$)) into the chamber 10. After supplying the precursor 21 and the carrier gas 31, the purge gas may be supplied into the chamber 10. In addition, after supplying the reaction gas 41, the purge gas may also be supplied into the chamber 10.

A deposition rate of a thin film to be formed on the substrate W may be determined by supply pressures and/or supply flow rates of the precursor 21 and the carrier gas 31. For example, if the supply pressures of the precursor 21 and the carrier gas 31 are increased, the deposition rate of the thin film may be increased. By contrast, if the supply pressures of the precursor 21 and the carrier gas 31 are lowered, the deposition rate of the thin film may be decreased.

In a general precursor source supplying unit, if the remaining amount of the precursor source decreases, the supply pressure of the precursor 21 may decrease. By contrast, the precursor supplying unit 20 may be configured to uniformly control the supply pressure of the precursor 21, regardless of a consumption or remaining amount of the precursor source 50. A deposition rate of the thin film may be controlled to be constant, until the precursor source 50 in the precursor supplying unit 20 is exhausted. Hereinafter, the precursor supplying unit 20 will be described in more detail below.

Figure 2A:
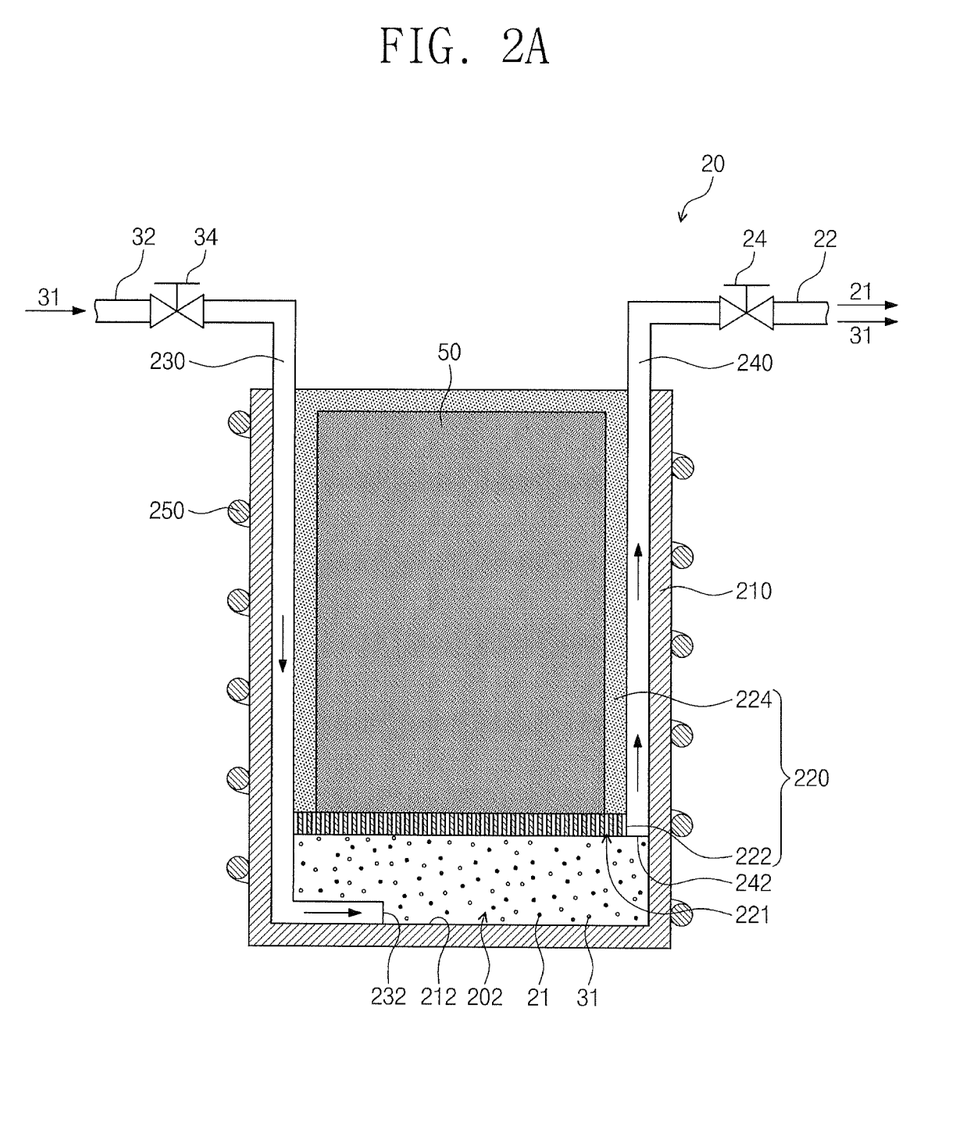
FIGS. 2A and 2B are sectional views illustrating an example of the precursor supplying unit of FIG. 1.
Figure 2B:
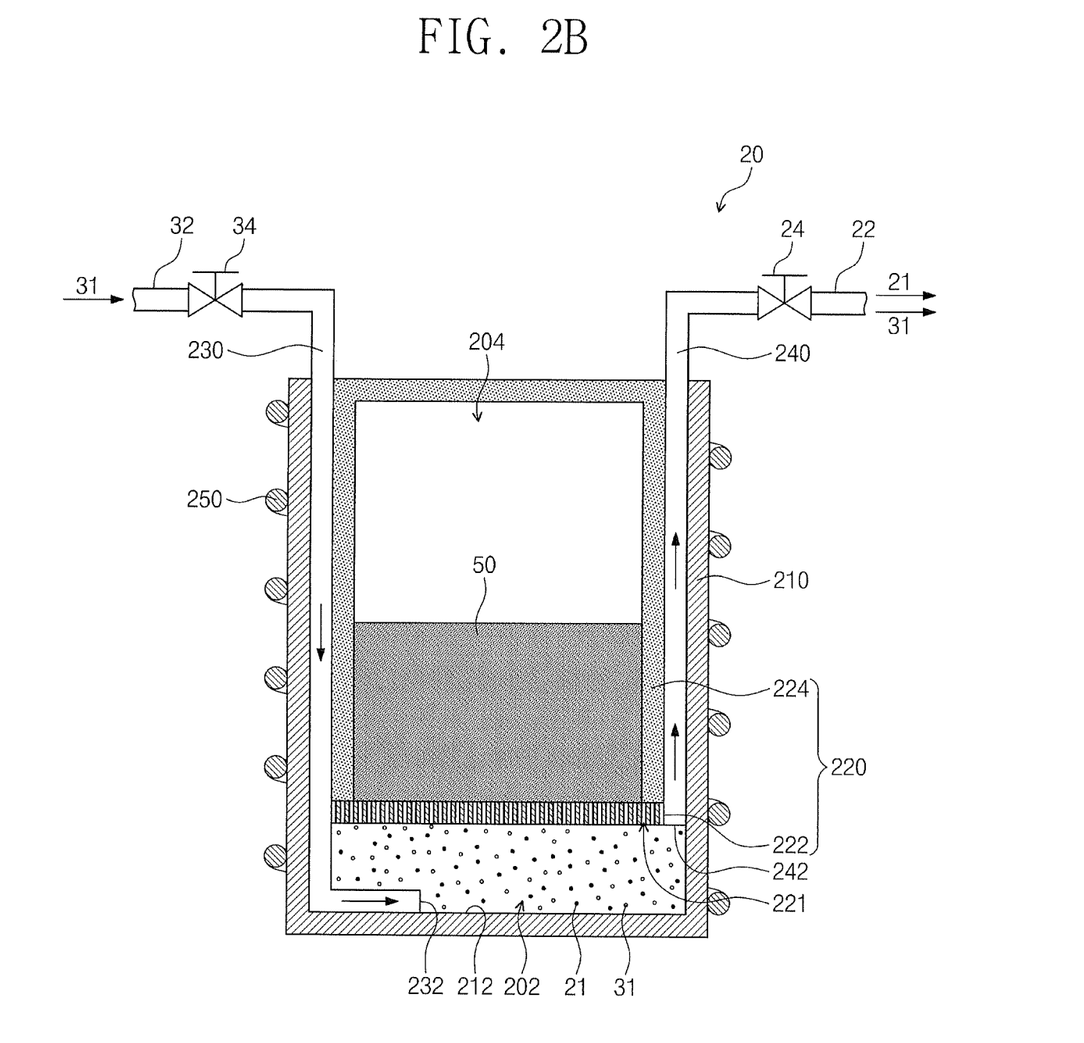

FIGS. 2A and 2B illustrate examples of the precursor supplying unit 20 of FIG. 1.

Referring to FIG. 2A, the precursor supplying unit 20 may include a canister. In some embodiments, the precursor supplying unit 20 may include an outer container 210, an inner container 220, a gas injection line 230, a gas exhaust line 240, and an outer heater 250.

The outer container 210 may be configured to contain the inner container 220, the gas injection line 230, and the gas exhaust line 240 therein. The outer container 210 may have a cylindrical shape.

The inner container 220 may be provided in the outer container 210. The inner container 220 may be used to store the precursor source 50, which is provided in a liquid or solid state. The inner container 220 may be configured to seal the precursor source 50. The inner container 220 may be a cylindrical structure whose volume is smaller than that of the outer container 210. In some embodiments, the inner container 220 may include a supporting membrane 222 and an upper cover 224.

The supporting membrane 222 may be spaced apart from an inner bottom 212 of the outer container 210. The supporting membrane 222 may be configured to support the precursor source 50. The supporting membrane 222 may be formed of or include porous alumina, porous titania, or porous zirconia. The supporting membrane 222 may have a plurality of pores 221. The pores 221 may be permeable to the precursor 21 and the carrier gas 31. For example, the precursor 21 and the carrier gas 31 may have a molecular diameter or size of about 1 nm or smaller, and each of the pores 221 may have a diameter ranging from about 1 nm to about 1 μm. The pores 221 may not be permeable to the precursor source 50 in the liquid or solid state. The precursor source 50 may be provided or present on the pores 221. The carrier gas 31 may be produced from the precursor source 50, which is in contact with the supporting membrane 222, by the precursor 21. The precursor source 50 may be vaporized and/or sublimated at an interface of the supporting membrane 222.

The precursor 21 may be moved into a space, which is located below the supporting membrane 222, through the pores 221. Since the precursor 21 has a molecular size smaller than that of the precursor source 50, the precursor 21 may pass through the pores 221. The precursor 21 and the carrier gas 31 may be positioned in a precursor passage space 202, which is provided between a bottom surface of the supporting membrane 222 and the inner bottom 212 of the outer container 210. The precursor passage space 202 may be defined as an internal space between the bottom surface of the supporting membrane 222 and the inner bottom 212 of the outer container 210. In addition, a distance between the bottom surface of the supporting membrane 222 and the inner bottom 212 of the outer container 210 may be defined as a height of the precursor passage space 202. For example, the height of the precursor passage space 202 may not be changed, regardless of a consumed or remaining amount of the precursor source 50.

The upper cover 224 may be provided to cover the precursor source 50 and the supporting membrane 222. The upper cover 224 may be connected to opposite edge of the supporting membrane 222. The upper cover 224 may be provided in such a way that a top surface thereof is coplanar with that of the outer container 210. An edge of the upper cover 224 and an edge of the supporting membrane 222 may be in contact with or fastened to the gas injection line 230 and the gas exhaust line 240.

The gas injection line 230 may be provided in a side portion of the outer container 210. The gas injection line 230 may extend from the second valve 34, which is provided on the outer container 210, toward the inner bottom 212 of the outer container 210. The gas injection line 230 may be interposed between a side surface of the side portion of the outer container 210 and a side surface of a side portion of the inner container 220. The gas injection line 230 may be in contact with or fastened to the side surface of the side portion of the outer container 210. The gas injection line 230 may have an injection port 232. The injection port 232 may be placed in the precursor passage space 202, which is positioned adjacent to the inner bottom 212 of the outer container 210. The carrier gas 31 may be provided into the precursor passage space 202 through the injection port 232. Although not shown, the injection port 232 may be configured to provide the carrier gas 31 toward the supporting membrane 222.

The gas exhaust line 240 may be provided in an opposite side portion of the outer container 210. The gas exhaust line 240 may extend from the first valve 24, which is provided on the outer container 210, toward a bottom surface of the supporting membrane 222 of the inner container 220. The gas exhaust line 240 may be interposed between a side surface of the opposite side portion of the outer container 210 and a side surface of an opposite side portion of the inner container 220. The gas exhaust line 240 may be in contact with or fastened to the side surface of the opposite side portion of the outer container 210. The gas exhaust line 240 may have an exhaust port 242. The exhaust port 242 may be placed in the precursor passage space 202, which is positioned adjacent to the supporting membrane 222. The precursor 21 and the carrier gas 31 in the precursor passage space 202 may be exhausted to the gas exhaust line 240 through the exhaust port 242. The precursor 21 and the carrier gas 31 in the gas exhaust line 240 may be provided into the chamber 10.

The outer heater 250 may be placed on an outer circumference surface of the outer container 210. The outer heater 250 may be used to heat the outer container 210. A creation amount of the precursor 21 may be increased in proportion to the temperature of the precursor source 50. The outer heater 250 may be used to heat the outer container 210 to a temperature that is lower than a vaporization or sublimation temperature of the precursor source 50.

Referring to FIG. 2B, as a cumulative supply amount of the precursor 21 increases, an amount of the precursor source 50 remaining in the inner container 220 may be reduced. If the precursor source 50 is consumed, a source consumption space 204 may be formed in the upper cover 224. The source consumption space 204 may be an internal space defined between a top surface of the precursor source 50 and an inner top surface of the upper cover 224. As the remaining amount of the precursor source 50 is reduced, the source consumption space 204 may be enlarged or expanded.

In some embodiments, the supporting membrane 222 and the precursor source 50 may separate the precursor passage space 202 from the source consumption space 204. A size of the source consumption space 204 may be inversely proportional to the remaining amount of the precursor source 50. If the remaining amount of the precursor source 50 is reduced, the size of the source consumption space 204 may be increased. By contrast, a size of the precursor passage space 202 may be constant regardless of the remaining amount of the precursor source 50. Also, supply pressures of the precursor 21 and the carrier gas 31 in the precursor passage space 202 may be constant. Accordingly, the supporting membrane 222 may prevent or suppress a reduction in supply pressures of the precursor 21 and the carrier gas 31, which are caused by consumption of the precursor source 50. It may be possible to prevent a reduction in the deposition rate of a thin film, which may occur when the supply pressures of the precursor 21 and the carrier gas 31 are reduced. Although not shown, if all of the precursor source 50 is exhausted, the supporting membrane 222 may be positioned at an interface between the precursor passage space 202 and the source consumption space 204. Accordingly, the precursor passage space 202 and the source consumption space 204 may be spaced apart from each other by the supporting membrane 222.

Figure 3:
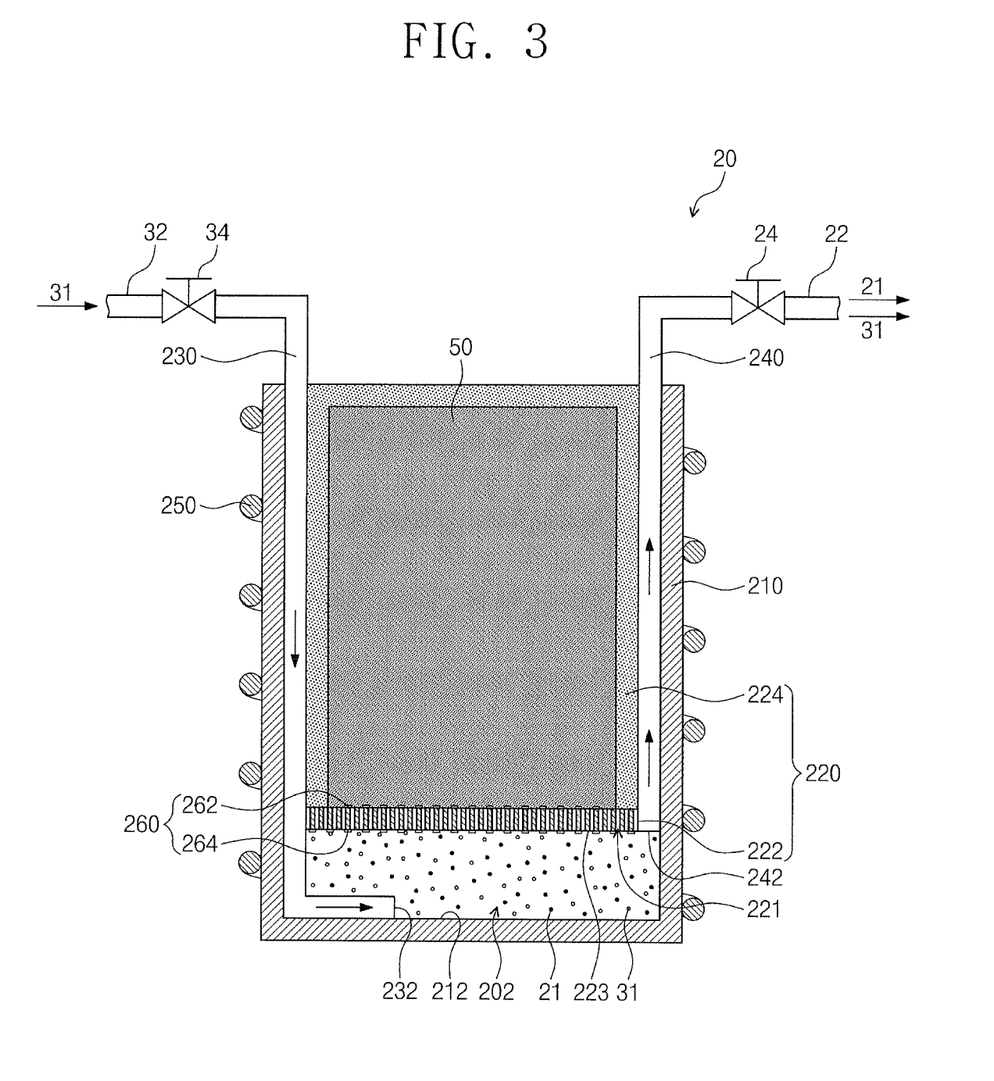
FIG. 3 is a sectional view illustrating an example of the precursor supplying unit of FIG. 1.

FIG. 3 illustrates another example of the precursor supplying unit 20 of FIG. 1.

Referring to FIG. 3, the precursor supplying unit 20 may further include inner heaters 260. The outer container 210, the inner container 220, the gas injection line 230, and the gas exhaust line 240 may be configured to have substantially the same features as those of FIGS. 2A and 2B.

The inner heaters 260 may be provided on and under the supporting membrane 222 of the inner container 220. For example, each of the inner heaters 260 may include a grid-shaped heater. The inner heaters 260 may be configured to heat the supporting membrane 222. The inner heaters 260 may be configured to locally heat a portion of the precursor source 50 that is located adjacent to the supporting membrane 222. The vaporization or sublimation of the precursor source 50 at an interface of the supporting membrane 222 may be accelerated by the inner heaters 260. For example, the inner heaters 260 may be placed on and under the supporting membrane 222 of the inner container 220. In some embodiments, the inner heaters 260 may include an upper heater 262 and a lower heater 264.

The upper heater 262 may be provided on a top surface of the supporting membrane 222. The upper heater 262 may be placed between the supporting membrane 222 and the precursor source 50. The upper heater 262 may be used to directly and/or locally heat the precursor source 50 adjacent to the supporting membrane 222. An amount of the precursor 21 to be produced may be increased in proportion to a heating temperature of the upper heater 262.

The lower heater 264 may be provided on a bottom surface of the supporting membrane 222. The lower heater 264 may be used to increase convection speed of the carrier gas 31 passing below the supporting membrane 222. The higher the convection speed of the carrier gas 31, the amount of the precursor 21 to be produced.

The substrate processing system 100 may be used in a process of fabricating a semiconductor device, as will be described below.

Figure 4:
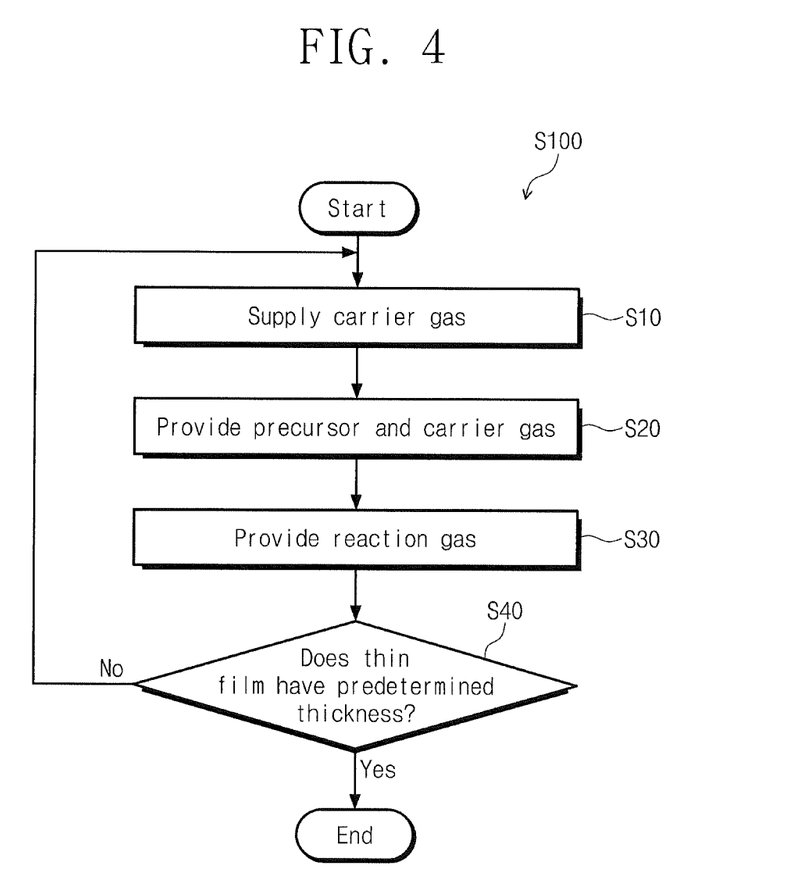
FIG. 4 is a flow chart illustrating a method of fabricating a semiconductor device, according to some embodiments of the inventive concept.

FIG. 4 is a flow chart illustrating a method of fabricating a semiconductor device, according to some embodiments of the inventive concept.

Referring to FIG. 4, a process S100 of fabricating a semiconductor device may include an ALD method. Alternatively, the fabrication process S100 may include a CVD method or a plasma etching method. In some embodiments, the fabrication process S100 may include supplying the carrier gas 31 in the precursor supplying unit 20 (in S10), providing the precursor 21 and the carrier gas 31 on the substrate W (in S20), providing the reaction gas 41 on the substrate W (in S30), and examining whether a thickness of a thin film is within a predetermined thickness range (in S40). If not, the earlier process steps may be repeated.

The carrier gas supplying unit 30 may provide the carrier gas 31 into the precursor supplying unit 20 (in S10). The carrier gas 31 may be provided into the precursor passage space 202.

Next, the precursor supplying unit 20 may be configured to provide the carrier gas 31 and the precursor 21 onto the substrate W in the chamber 10 (in S20). The precursor 21 may be provided into the chamber 10, without a reduction in supply pressure to be caused by consumption of the precursor source 50.

Figure 5:
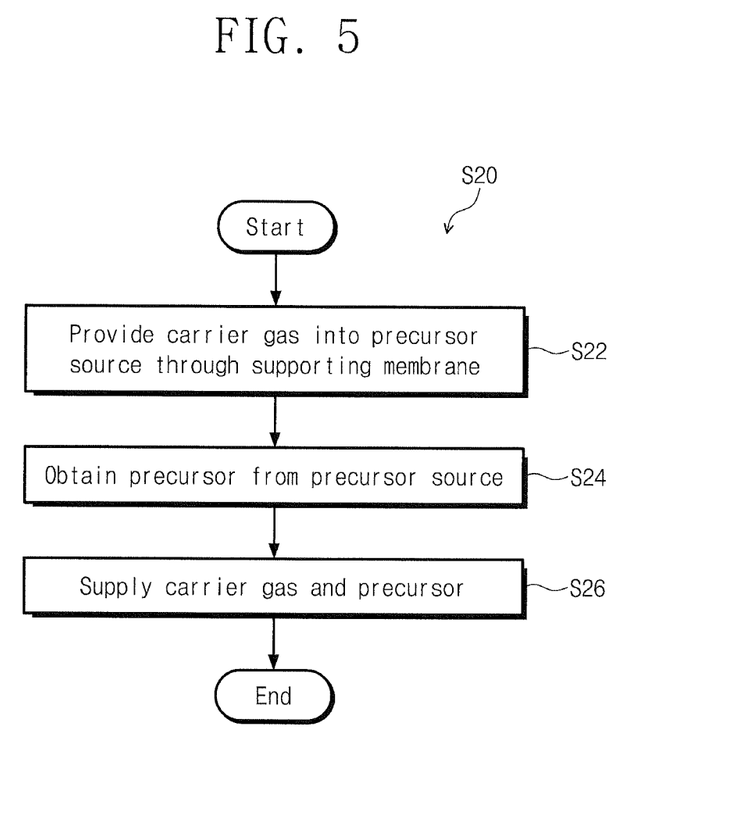
FIG. 5 is a flow chart illustrating an example of the step of providing a precursor and a carrier gas, shown in FIG. 4.

FIG. 5 is a flow chart illustrating an example of the step S20 of supplying the precursor 21 and the carrier gas 31, shown in FIG. 4.

Referring to FIG. 5, the step S20 of supplying the precursor 21 and the carrier gas 31 may include providing the carrier gas 31 into the precursor source 50 through the supporting membrane 222 (in S22), obtaining the precursor 21 from the precursor source 50 using the carrier gas 31 (in S24), and supplying the carrier gas 31 and the precursor 21 (in S26).

The precursor supplying unit 20 may be configured to inject the carrier gas 31 into the precursor passage space 202 through the gas injection line 230 and provide the carrier gas 31 to the precursor source 50 through the pores 221 (in S22). The precursor source 50 in the liquid or solid state may be vaporized or sublimated by the carrier gas 31, and thus, the precursor 21 may be produced in the pores 221. If the precursor source 50 is consumed, a source consumption space 204 may be formed in the upper cover 224 of the inner container 220. If the remaining amount of the precursor source 50 is reduced, a size of the source consumption space 204 may be increased.

Next, the precursor supplying unit 20 may be configured to obtain the precursor 21 in the precursor passage space 202, which is located below the supporting membrane 222 (in S24). The precursor 21 may be infiltrated into the precursor passage space 202, which is located below the supporting membrane 222. The precursor 21 and the carrier gas 31 may be mixed with each other in the precursor passage space 202. Since the precursor passage space 202 has a uniform size, supply pressures of the precursor 21 and the carrier gas 31 may be constant in the precursor passage space 202.

Next, the precursor supplying unit 20 may supply the carrier gas 31 and the precursor 21 to the chamber 10 through the gas exhaust line 240 (in S26). Supply pressures of the precursor 21 and the carrier gas 31 may be constantly maintained regardless of the consumption of the precursor source 50. The precursor 21 may be used to form a single precursor layer (not shown) on the substrate W in the chamber 10.

Although not shown, a purge gas may be provided into the chamber 10. The purge gas may be used to remove the precursor 21 from the chamber 10.

Referring back to FIG. 4, the reaction gas supplying unit 40 may supply the reaction gas 41 onto the substrate W (in S30). The reaction gas 41 may be reacted with the precursor 21 on the substrate W, thereby forming a thin film deposited on the substrate W. The thin film may include a single layer and/or an atomic layer whose thickness ranges from about several angstroms to about several nanometers.

Although not shown, a purge gas may be provided into the chamber 10. The purge gas may be used to remove the reaction gas 41 from the chamber 10.

Next, a controller (not shown) may examine whether a thickness of the thin film is within a predetermined thickness range (in S40). If the thickness of the thin film is not within the predetermined thickness range, the steps S10 to S40 may be repeated.

According to some embodiments of the inventive concept, in a precursor supply unit, a source consumption space, in which a liquid or solid precursor source is consumed, is separated from a precursor passage space, and this may make it possible to suppress or prevent a reduction in supply pressure of the precursor in the precursor passage space, which is caused by consumption of the precursor source. In addition, it may be possible to prevent a reduction in deposition rate of a thin film, which may be caused by the reduction of the supply pressure.

While example embodiments of the inventive concepts have been particularly shown and described, it will be understood by one of ordinary skill in the art that variations in form and detail may be made therein without departing from the spirit and scope of the attached claims.

What is claimed is:

1. A precursor supply unit, comprising:
an outer container;
an inner container provided in the outer container and capable of storing a precursor source;
a gas injection line having an injection port, the gas injection line provided below the inner container and in the outer container; and a gas exhaust line having an exhaust port, the gas exhaust line provided below the inner container and in the outer container and a precursor produced from the precursor source, wherein the inner container comprises a supporting membrane supporting the precursor source and having pores that are permeable to the carrier gas and the precursor, and wherein the supporting membrane provides a precursor passage space defined by a first internal space between an inner bottom of the outer container and a bottom surface of the supporting membrane.

2. The precursor supply unit of claim 1, wherein the supporting membrane comprises porous alumina, porous titania, or porous zirconia.

3. The precursor supply unit of claim 1, wherein the injection port and the exhaust port are disposed between the supporting membrane and an inner bottom of the outer container.

4. The precursor supply unit of claim 3, wherein the injection port is disposed adjacent to the inner bottom of the outer container, and the exhaust port is placed adjacent to the supporting membrane.

5. The precursor supply unit of claim 1, wherein the supporting membrane is provided to separate a source consumption space, which is defined in the inner container and on the precursor source, from the precursor passage space.

6. The precursor supply unit of claim 5, wherein the inner container comprises an upper cover covering the precursor source on the supporting membrane, and the source consumption space is a second internal space that is defined between a top surface of the precursor source and an inner top surface of the upper cover.

7. The precursor supply unit of claim 1, further comprising an outer heater that is provided outside the outer container.

8. The precursor supply unit of claim 7, further comprising an inner heater that is provided in the outer container.

9. The precursor supply unit of claim 8, wherein the inner heater comprises an upper heating element that is provided on a top surface of the supporting membrane.

10. The precursor supply unit of claim 9, wherein the inner heater further comprises a lower heating element that is provided on the bottom surface of the supporting membrane.

11. A substrate processing system, comprising:
a chamber comprising a susceptor, which is configured to receive a substrate;
a precursor supply unit supplying a precursor onto the substrate; and
a carrier gas supply unit supplying a carrier gas, which is used to deliver the precursor in the chamber, into the precursor supplying unit, wherein the precursor supply unit comprises:
an outer container;
an inner container provided in the outer container and capable of storing a precursor source;
a gas injection line having an injection port, the gas injection line provided below the inner container and in the outer container; and
a gas exhaust line having an exhaust port, which is provided below the inner container and in the outer container, wherein the inner container comprises a supporting membrane supporting the precursor source and having pores that are permeable to the carrier gas and the precursor, and wherein the supporting membrane provides a precursor passage space defined by a first internal space between an inner bottom of the outer container and a bottom surface of the supporting membrane.

12. The substrate processing system of claim 11, further comprising:
a first gas line connecting the precursor supply unit to the chamber; and
a first valve connected to the first gas line to control flow rates of the precursor and the carrier gas, wherein the gas exhaust line is connected to the first valve.

13. The substrate processing system of claim 12, wherein the first valve is provided at a side of the outer container, and the gas exhaust line is interposed between a side surface of the inner container and a side surface of the outer container and is extended from the first valve to a bottom surface of the supporting membrane.

14. The substrate processing system of claim 11, further comprising:
a second gas line connecting the carrier gas supply unit to the precursor supplying line; and
a second valve connected to the second gas line and used to control a flow rate of the carrier gas, wherein the gas injection line is connected to the second valve.

15. The substrate processing system of claim 14, wherein the second valve is provided at an opposite side of the outer container, and the gas injection line is interposed between an opposite side surface of the inner container and an opposite side surface of the outer container and is extended from the second valve to an inner bottom surface of the outer container.

* * * * *